(12) United States Patent
Baglin et al.

(10) Patent No.: US 7,042,281 B2
(45) Date of Patent: May 9, 2006

(54) CIRCUIT ARRANGEMENT FOR VOLTAGE REGULATION

(75) Inventors: Thomas J. Baglin, Rueil (FR); Gerhard Nebel, Immenstadt (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/107,986

(22) Filed: Apr. 15, 2005

(65) Prior Publication Data

US 2005/0243623 A1 Nov. 3, 2005

Related U.S. Application Data

(63) Continuation of application No. PCT/DE03/03283, filed on Oct. 2, 2003.

(30) Foreign Application Priority Data

Oct. 17, 2002 (DE) ................................. 102 48 498

(51) Int. Cl.
G05F 1/10 (2006.01)
(52) U.S. Cl. ...................... 327/541; 327/535; 327/390
(58) Field of Classification Search ................ 327/390, 327/534, 535, 536, 537
See application file for complete search history.

(56) References Cited

U.S. PATENT DOCUMENTS

| | | | | |
|---|---|---|---|---|
| 5,654,628 A | * | 8/1997 | Feldtkeller | ................. 323/282 |
| 6,049,201 A | * | 4/2000 | Feldtkeller | ................. 323/288 |
| 6,114,876 A | | 9/2000 | Kwong et al. | |
| 6,188,212 B1 | * | 2/2001 | Larson et al. | ............... 323/281 |
| 6,201,375 B1 | | 3/2001 | Larson et al. | |
| 6,396,334 B1 | * | 5/2002 | Aram | ......................... 327/541 |
| 6,483,376 B1 | * | 11/2002 | Bienvenu et al. | ........... 327/536 |
| 6,724,227 B1 | * | 4/2004 | Imai | ........................... 327/108 |
| 6,741,118 B1 | * | 5/2004 | Uchikoba et al. | ........... 327/541 |
| 2003/0210089 A1 | * | 11/2003 | Tanzawa et al. | ............ 327/536 |
| 2004/0251955 A1 | * | 12/2004 | Neidorff | ...................... 327/536 |

FOREIGN PATENT DOCUMENTS

DE 43 25 899 C2 2/1995
DE 198 18 465 C2 10/1999

OTHER PUBLICATIONS

Tietz, Ulrich et al.;"Halbleiter-Schaltungstechnik"; Springer-Verlag, 1993, pp. 62-63.

* cited by examiner

Primary Examiner—Terry D. Cunningham
(74) Attorney, Agent, or Firm—Darby & Darby

(57) ABSTRACT

Circuit arrangement for voltage regulation having a differential amplifier having first and second inputs and first and second outputs, wherein a reference voltage is applied to the first input and a voltage to be regulated is applied to the second input. A charge pump is connected to the first output of the differential amplifier. A current mirror is connected to the second output of the differential amplifier. A transistor, which influences the voltage to be regulated, has its control input connected to the current mirror and the charge pump.

18 Claims, 1 Drawing Sheet

US 7,042,281 B2

CIRCUIT ARRANGEMENT FOR VOLTAGE REGULATION

CROSS-REFERENCE TO RELATED APPLICATION

This application is a continuation of International Patent Application Ser. No. PCT/DE2003/003283, filed Oct. 2, 2003, which published in German on May 13, 2004 as WO 2004/040760, and is incorporated herein by reference in its entirety.

FIELD OF THE INVENTION

The invention relates to a circuit arrangement for voltage regulation.

BACKGROUND OF THE INVENTION

Voltage regulators based on an N-channel MOS (NMOS) technology are suitable for the control or regulation of severely noisy power supplies. It is disadvantageous, however, that NMOS voltage regulators require a charge pump in order to be able to sufficiently increase the voltage at the gate of the NMOS transistor. In portable applications, in particular, it is disadvantageous, however, that the charge pump has a considerable current consumption during operation.

FIG. 1 shows an in-house conventional circuit arrangement in which the current consumption of the charge pump can be reduced. For this purpose, the charge pump is switched off if the voltage at the gate of the NMOS transistor has assumed the correct value. The circuit arrangement for voltage regulation in FIG. 1 is based in principle on a binary regulation. The circuit arrangement has a first differential amplifier AMP1 and a second differential amplifier AMP2 with two inputs in each case. The noninverting input of the first differential amplifier AMP1 and also the inverting input of the second differential amplifier AMP2 are connected to a reference potential VREF. Via a voltage divider comprising three resistors R1, R2 and R3, the inverting input of the first differential amplifier AMP1 is connected to the potential UP, which is also referred to as first divider voltage, and the noninverting input of the second differential amplifier AMP2 is connected to the potential DN, which is also referred to as second divider voltage. The voltage divider is located between the voltage VDD to be regulated and a reference potential GND. The potential UP can be tapped off between the first resistor R1 and the second resistor R2. The potential DN can be tapped off between the second resistor R2 and the third resistor R3. The output EN of the first differential amplifier AMP1 leads to the input of an oscillator OSZ. The oscillator OSZ with constant frequency generates, if the voltage VDDEXT is present at its input EN, a signal with constant frequency. However, if no voltage is present at its input EN, the oscillator OSZ does not generate a signal at its output either. The output of the oscillator OSZ is in turn connected to the charge pump LP, which generates a voltage depending on the frequency generated by the oscillator OSZ, said voltage being present at the charge pump output 4.1. The output of the second differential amplifier AMP2 leads to the control input of a second NMOS transistor NMOS2. The output of the charge pump LP is connected to the control output of the NMOS transistor NMOS2, a capacitor CAP and the control input of the NMOS transistor NMOS1. The external supply voltage VDDEXT present at the input VDDEXT of the circuit is passed, on the one hand, to the drain terminal of the first NMOS transistor NMOS1 and, on the other hand, to the supply terminal 1.2 of the first differential amplifier AMP1, the control terminal 3.1 of the oscillator OSZ with constant frequency and also to the supply terminal 2.1 of the second differential amplifier AMP2.

The principle underlying the circuit arrangement for voltage regulation as is shown in FIG. 1 consists in using the capacitor CAP as a storage element and, moreover, in switching on the charge pump LP and also the NMNOS transistor NMOS2 only if the voltage at the gate of the NMOS transistor NMOS1 is to be increased or reduced. For the time for which the charge pump LP is switched off, the voltage is stored in the capacitor CAP. The two differential amplifiers AMP1 and AMP2 operate as comparators. A voltage window may be generated with the aid of the reference voltage VREF and the two comparators AMP1 and AMP2. If the supply voltage or operating voltage VDD is too low, that is to say lies outside the voltage window, the charge pump LP is activated. If the supply voltage VDD is too high, the gate of the first NMOS transistor NMOS1 is discharged via the second NMOS transistor NMOS2. As long as the supply voltage VDD lies within the voltage window, neither the charge pump LP nor the second NMOS transistor NMOS2 is activated. The current consumption is thus reduced. Apart from the two differential amplifiers AMP1 and AMP2, neither the oscillator OSZ nor the charge pump LP nor the second NMOS transistor NMOS2 then consume current.

In detail, the circuit illustrated in FIG. 1 functions as follows. If the supply voltage VDD has the nominal value, the reference voltage VREF lies between the potentials UP and DN generated by the voltage divider. The consequence of this is that the voltage at the output EN of the first differential amplifier AMP1 and the voltage at the output PULLDN of the second differential amplifier AMP2 are at the value 0. This in turn has the consequence that the charge pump LP is deactivated and the second NMOS transistor NMOS2 is switched off. The voltage at the node NGATE and thus at the gate of the NMOS transistor NMOS1 is therefore influenced neither by the charge pump LP nor by the NMOS transistor NMOS2. The voltage at the node NGATE is prevented from drifting with the aid of the capacitor CAP.

If the supply voltage VDD assumes an excessively high value, the potential DN rises above the reference voltage VREF. This has the effect that, with the aid of the second differential amplifier AMP2, the voltage at the output PULLDN of the second differential amplifier AMP2 rises from the value 0 to the value of the external supply voltage VDDEXT. The node NGATE and the gate of the NMOS transistor NMOS1 are thus pulled to the reference potential GND via the second NMOS transistor NMOS2. The consequence of this is that the current that flows from the input VDDEXT of the circuit to the output VDD of the circuit decreases. The supply voltage VDD thus decreases until the reference voltage VREF again lies between the two potentials UP and DN.

If the supply voltage VDD decreases to an excessively great extent, the potential UP falls below the value of the reference voltage VREF. The voltage at the output EN of the first differential amplifier AMP1 then changes from the value 0 to the value of the external supply voltage VDDEXT and the oscillator OSZ for generating a constant frequency is activated. The oscillator OSZ generates a signal CLK with a constant frequency, which has the effect that the charge pump LP increases the voltage at the node NGATE. The current that flows between the input VDDEXT of the circuit and the output VDD of the circuit thus increases, which has the effect that the supply voltage VDD rises until the reference voltage VREF again lies between the two potentials UP and DN.

A circuit of this type has the disadvantage, however, that it is designed as a digital system. The circuit is therefore unable to adapt itself to the degree of deviation of the supply voltage VDD. Irrespective of whether the supply voltage VDD is far from its nominal value or close to the latter, the same voltage at the node NGATE is always generated with the aid of the charge pump LP and the second NMOS transistor NMOS2. Therefore, a compromise is required between the regulating speed of the system and the ripple of the supply voltage VDD. If the charge pump LP and the second NMOS transistor NMOS2 are too strong, although the system becomes fast, that is to say the system can then be switched on rapidly and a change in the supply voltage VDD brought about by a change in the load is compensated for rapidly, at the same time the supply voltage VDD has large voltage steps when the charge pump LP, the oscillator OSZ and the second NMOS transistor NMOS2 are switched on and off.

SUMMARY OF THE INVENTION

It is an object of the invention, therefore, to specify a circuit arrangement for voltage regulation in which, on the one hand, the current consumption is as low as possible and, on the other hand, large voltage steps do not occur if the load changes at the output of the circuit.

Thus, the circuit arrangement for voltage regulation according to the invention has a differential amplifier with two inputs and two outputs, with a reference voltage and a voltage that is to be regulated respectively applied to the inputs. Moreover, a charge pump is provided, which is connected to the first output of the differential amplifier. A current mirror is furthermore provided, which is connected to the second output of the differential amplifier. The voltage to be regulated can be influenced via a transistor, the control input of which is connected to the current mirror and the charge pump.

BRIEF DESCRIPTION OF THE DRAWINGS

The invention is explained in more detail below with reference to two figures.

DETAILED DESCRIPTION OF PREFERRED EMBODIMENTS OF THE INVENTION

Figure 1:
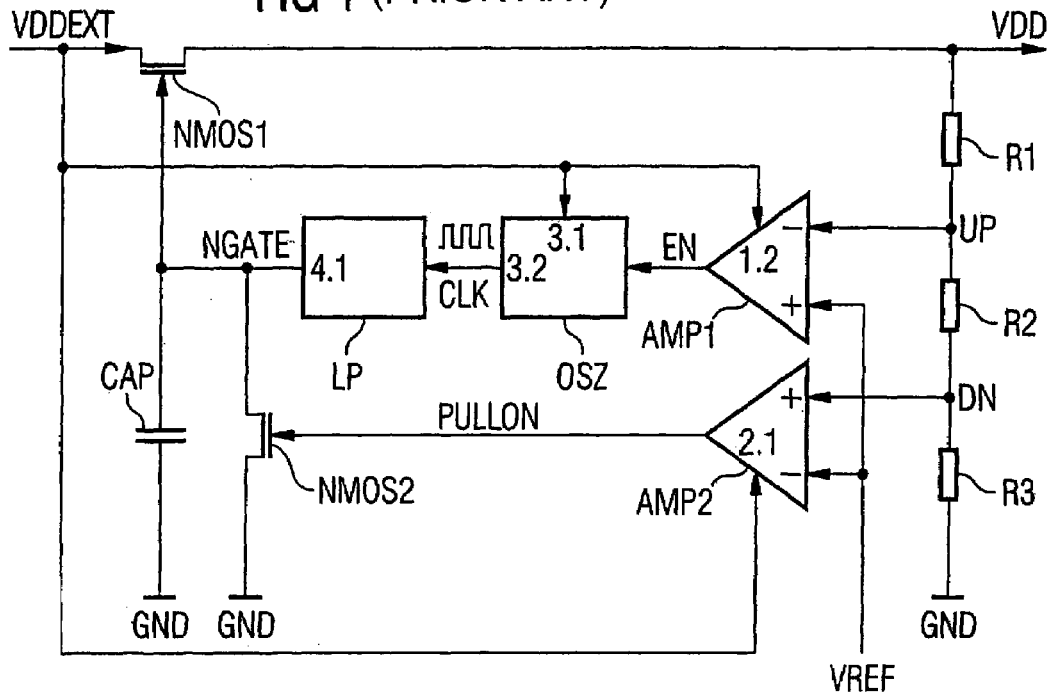
FIG. 1 shows a conventional circuit for voltage regulation.
Figure 2:
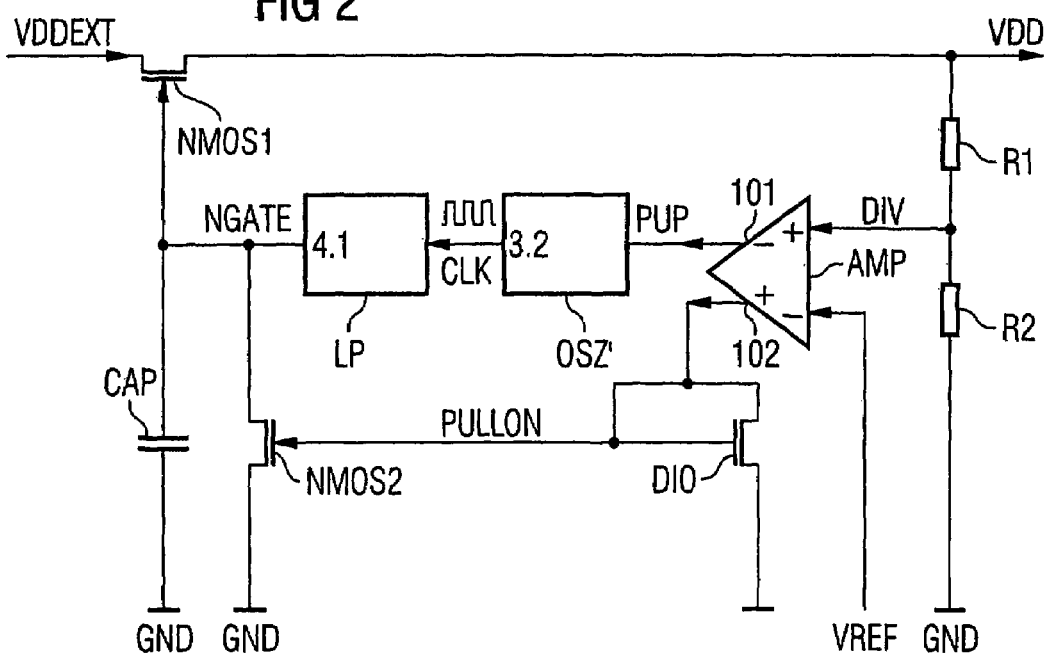
FIG. 2 shows a circuit for voltage regulation in accordance with the invention.

The circuit arrangement for voltage regulation according to the invention as shown in FIG. 2 is provided with a differential amplifier AMP with an inverting input, a noninverting input, an inverting output 10.1 and a noninverting output 10.2. The inverting input of the differential amplifier AMP is connected to a reference potential VREF while the noninverting input of the differential amplifier AMP is connected to the output of a voltage divider. The voltage divider comprises two series-connected resistors R1 and R2, the second resistor R2 being connected to the reference potential GND and the first resistor R1 being connected to the operating voltage VDD. The voltage divider generates a divider voltage DIV which is present at the noninverting input of the differential amplifier AMP.

The inverting output 10.1 of the differential amplifier AMP is connected to the input of the oscillator OSZ'. The higher the current at the input of the oscillator OSZ', the greater the frequency becomes at the output of the oscillator OSZ'. The output of the oscillator OSZ' is in turn connected to the charge pump LP. The noninverting output 10.2 of the differential amplifier AMP is connected to the gate terminals of a first NMOS transistor DIO and of a second NMOS transistor NMOS2. The two NMOS transistors DIO and NMOS2 together form a current mirror which is connected, on the output side, that is to say via the control output of the second NMOS transistor NMOS2, to the output 4.1 of the charge pump LP, the capacitor CAP and the control input of the first NMOS transistor NMOS1. This connection forms the node NGATE. The two NMOS transistors NMOS2 and DIO are also referred to as current mirror transistors hereinafter.

In the case of the circuit arrangement shown in FIG. 2, the strength of the charge pump LP and of the second current mirror transistor NMOS2 is controlled in a manner dependent on the value of the operating voltage VDD. The differential amplifier AMP with its two current outputs is used for this purpose. The first current output 10.1 of the differential amplifier AMP, which is the inverting output, is activated if the operating voltage VDD is too low, which is the case if the divider voltage DIV is less than the reference voltage VREF. The output 10.1 controls the current-controlled oscillator OSZ' by means of the control current UP. The second output 10.2 of the differential amplifier AMP is activated if the operating voltage VDD or the divider voltage DIV is too high with respect to the reference voltage VREF. The NMOS transistor DIO is then turned on via the output 10.2 in order to charge the gate of the second current mirror transistor NMOS2. The value of the current at the output 10.1 and the value of the current at the output 10.2 of the differential amplifier AMP are proportional to the voltage difference between the operating voltage VDD or the divider voltage DIV and the reference voltage VREF.

The method of operation of the circuit shown in FIG. 2 is described in detail below.

If the operating voltage VDD has its nominal value, the differential amplifier AMP does not generate a current either at the output 10.1 or at the output 10.2. The current-controlled oscillator OSZ' therefore does not generate a signal CLK at the output 3.2 either. Since the output 10.2 does not generate a current either, the NMOS transistor NMOS2 is in the high-impedance state. The voltage at the node NGATE and thus at the gate of the NMOS transistor NMOS1 is thus prescribed neither by the charge pump LP nor by the NMOS transistor NMOS2. In order to prevent the voltage at the node NGATE from drifting, provision is made of the capacitor CAP connected between the gate of the NMOS transistor NMOS1 and the reference potential GND.

If the operating voltage VDD rises above the nominal value, the differential amplifier AMP gradually increases its current at the output 10.2. By contrast, no current is generated at the output 10.1 of the differential amplifier AMP. The charge pump LP therefore remains switched off. The current PULLDN at the output 10.2 of the differential amplifier AMP is mirrored onto the control input of the NMOS transistor NMOS1 with the aid of the current mirror. In this way, if the operating voltage VDD rises above its nominal value, the gate of the NMOS transistor NMOS1 is pulled more and more in the direction of the reference potential GND. The current that flows between the circuit input VDDEXT and the circuit output VDD decreases until the operating voltage VDD has again reached its nominal value.

If the operating voltage VDD falls below the nominal value, the differential amplifier AMP generates a gradually increasing current PUP at the output 10.1. By contrast, no current is generated at the output 10.2, so that the NMOS transistor NMOS2 remains switched off, that is to say in the nonconducting state. The current-controlled oscillator OSZ' then generates a signal CLK with a frequency that is proportional to the difference between the instantaneous operating voltage VDD and the nominal value of the operating voltage. The gate of the NMOS transistor NMOS1 is thereupon gradually pumped upward to a greater extent. The current that flows between the circuit input VDDEXT and the circuit output VDD then increases until the operating voltage VDD has again reached its nominal value.

Consequently, in the case of the circuit arrangement shown in FIG. 2, as soon as a difference is established between the divider voltage DIV and the reference voltage VREF, the correspondingly required measure, that is to say increase voltage or decrease voltage, is initiated. This involves an analog regulation. In this way, it is possible to avoid large voltage steps in the operating voltage VDD during the tracking of the operating voltage VDD without the tracking of the operating voltage VDD incurring any retardation.

Finally, the circuit arrangement for voltage regulation according to the invention may be used in a portable electronic device.

The preceding description of the exemplary embodiments in accordance with the present invention serves only for illustrative purposes and not for the purpose of restricting the invention. In the context of the invention, various changes and modifications are possible without departing from the scope of the invention and its equivalents.

What is claimed is:

1. A circuit arrangement for voltage regulation, comprising:
    a differential amplifier having first and second inputs and first and second outputs, wherein a reference voltage is applied to the first input and a voltage to be regulated is applied to the second input;
    a charge pump connected to the first output of the differential amplifier;
    a current mirror connected to the second output of the differential amplifier; and
    a transistor, which influences the voltage to be regulated, having the control input connected to the current mirror and the charge pump.

2. The circuit arrangement as claimed in claim 1, further comprising a capacitor connected to the control input of the transistor.

3. The circuit arrangement as claimed in claim 1, further comprising a voltage divider having its input connected to the voltage to be regulated and its output connected to the second input of the differential amplifier.

4. The circuit arrangement as claimed in claim 1, wherein the current mirror has a first current mirror transistor and a second current mirror transistor.

5. The circuit arrangement as claimed in claim 1, further comprising a controllable oscillator connected between the differential amplifier and the charge pump.

6. The circuit arrangement as claimed in claim 5, wherein the controllable oscillator is a current-controlled oscillator.

7. The circuit arrangement as claimed in claim 1, wherein the transistor is an N-channel MOS transistor.

8. The circuit arrangement as claimed in claim 1, wherein the first input of the differential amplifier is the inverting input and second input of the differential amplifier is the noninverting input.

9. The use of the circuit arrangement as claimed in claim 1 in a portable electronic device.

10. A circuit arrangement for voltage regulation, comprising:
    a differential amplifying means having first and second inputs and first and second outputs, wherein a reference voltage is applied to the first input and a voltage to be regulated is applied to the second input;
    a charge pumping means connected to the first output of the differential amplifying means;
    a current mirroring means connected to the second output of the differential amplifying means; and
    a transistor for influencing the voltage to be regulated, the having its control input connected to the current mirroring means and the charge pumping means.

11. The circuit arrangement as claimed in claim 10, further comprising a capacitor connected to the control input of the transistor.

12. The circuit arrangement as claimed in claim 10, further comprising a voltage dividing means having its input connected to the voltage to be regulated and its output connected to the second input of the differential amplifying means.

13. The circuit arrangement as claimed in claim 10, wherein the current mirroring means has a first current mirror transistor and a second current mirror transistor.

14. The circuit arrangement as claimed in claim 10, further comprising a controllable oscillating means connected between the differential amplifying means and the charge pumping means.

15. The circuit arrangement as claimed in claim 14, wherein the controllable oscillating means is a current-controlled oscillating means.

16. The circuit arrangement as claimed in claim 10, wherein the transistor is an N-channel MOS transistor.

17. The circuit arrangement as claimed in claim 10, wherein the first input of the differential amplifying means is the inverting input and the second input of the differential amplifying means is the noninverting input.

18. The use of the circuit arrangement as claimed in claim 10 in a portable electronic device.

* * * * *

UNITED STATES PATENT AND TRADEMARK OFFICE
CERTIFICATE OF CORRECTION

| | | |
|---|---|---|
| PATENT NO. | : 7,042,281 B2 | Page 1 of 1 |
| APPLICATION NO. | : 11/107986 | |
| DATED | : May 9, 2006 | |
| INVENTOR(S) | : Thomas Baglin et al. | |

It is certified that error appears in the above-identified patent and that said Letters Patent is hereby corrected as shown below:

Column 6, lines 27-28, "the having" should read --the transistor having--.

Signed and Sealed this

Seventh Day of November, 2006

JON W. DUDAS
*Director of the United States Patent and Trademark Office*